United States Patent
Lee

(10) Patent No.: US 9,373,381 B2
(45) Date of Patent: Jun. 21, 2016

(54) SYSTEM INCLUDING MEMORIES SHARING CALIBRATION REFERENCE RESISTOR AND CALIBRATION METHOD THEREOF

(71) Applicant: SK hynix Inc., Icheon-si Gyeonggi-do (KR)

(72) Inventor: Hyun Woo Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/487,605

(22) Filed: Sep. 16, 2014

(65) Prior Publication Data
US 2015/0364177 A1    Dec. 17, 2015

(30) Foreign Application Priority Data
Jun. 12, 2014 (KR) .................. 10-2014-0071260

(51) Int. Cl.
*G11C 7/06* (2006.01)
*G11C 8/18* (2006.01)
*G11C 7/14* (2006.01)
*G11C 29/02* (2006.01)
*G11C 29/50* (2006.01)

(52) U.S. Cl.
CPC .. *G11C 8/18* (2013.01); *G11C 7/14* (2013.01); *G11C 29/022* (2013.01); *G11C 29/028* (2013.01); *G11C 29/50008* (2013.01)

(58) Field of Classification Search
CPC ............ G11C 5/04; G11C 5/06; G11C 5/063; G11C 7/22; G11C 7/222; G11C 7/1051
USPC .................. 365/52, 63, 189.07, 194
See application file for complete search history.

(56) References Cited

U.S. PATENT DOCUMENTS

| | | | |
|---|---|---|---|
| 7,269,043 B2 | 9/2007 | Lee | |
| 2009/0015312 A1* | 1/2009 | Kuwahara | G11C 7/04 327/330 |
| 2011/0066798 A1* | 3/2011 | Kaiwa | G11C 7/04 711/106 |

* cited by examiner

*Primary Examiner* — Thao-O H Bui
(74) *Attorney, Agent, or Firm* — William Park & Associates Ltd.

(57) ABSTRACT

A semiconductor apparatus includes a first memory, a second memory, and a shared reference resistor. The first memory is electrically coupled to the shared reference resistor, and the second memory is also electrically coupled to the shared reference resistor. Each of the first and second memories performs a basic calibration operation thereof by selectively using the shared reference resistor in response to a clock signal, and a mirror function signal, which has different logic levels according to which memory between the first and second memories performs calibration operations.

20 Claims, 6 Drawing Sheets

US 9,373,381 B2

SYSTEM INCLUDING MEMORIES SHARING CALIBRATION REFERENCE RESISTOR AND CALIBRATION METHOD THEREOF

CROSS-REFERENCES TO RELATED APPLICATION

The present application claims priority under 35 U.S.C. §119(a) to Korean application number 10-2014-0071260 filed on Jun. 12, 2014 in the Korean Intellectual Property Office, which is incorporated herein by reference in its entirety.

BACKGROUND

1. Technical Field

Embodiments of the present invention generally relate to an integrated circuit, and more particularly, in one or more embodiments, to a system having a plurality of memories.

2. Related Art

In an electronic system where a memory controller controls a memory chip, they can communicate through a signal transmission line. In order to meet demands of high-performance electronic system, some communication standards, which may apply to the communication between the memory and the memory controller, require high data rates and low signal swings. At the low signal swings, however, even a relatively small amount of external noise or impedance mismatching in the signal transmission line between the memory chip and the memory controller may cause signal distortion.

On-die termination (ODT) is the technology where resistors for impedance matching in such a transmission line are located inside a semiconductor chip instead of on somewhere outside the semiconductor chip. The ODT technology may also apply to the memory chip.

In addition, in a situation where impedance values need to be calibrated over process, voltage, and temperature (PVT) variation, ZQ calibration technology may be used. For example, a memory chip may be coupled to external reference resistors, and ZQ calibration can be carried out by using the external reference resistors.

SUMMARY

In an embodiment of the present invention, a semiconductor apparatus may include a first memory electrically coupled to a first end of a shared reference resistance; and a second memory electrically coupled to a second end of the shared reference resistance, wherein each of the first and second memories performs a basic calibration operation thereof by selectively using the shared reference resistance in response to a clock signal, and a mirror function signal.

In an embodiment of the present invention, a semiconductor apparatus may include a first memory electrically coupled to a first end of a shared reference resistance; and a second memory electrically coupled to the first end of the shared reference resistance, wherein a second end of the shared reference resistance is electrically coupled to a ground voltage, and wherein each of the first and second memories performs a basic calibration operation thereof through selective connection to the shared reference resistance in response to a clock signal, and a mirror function signal.

In an embodiment of the present invention, a method of calibration for a semiconductor apparatus including first and second memories commonly coupled to a shared reference resistance may include performing a basic calibration operation for one of the first and second memories for a first time section in response to a clock signal, and a mirror function signal; performing the basic calibration operation for the other one of the first and second memories for the first time section in response to the clock signal, and the mirror function signal; and alternately performing correction calibration operations for the first and second memories in response to an operation control signal, and the mirror function signal.

BRIEF DESCRIPTION OF THE DRAWINGS

Features, aspects and embodiments are described in conjunction with the attached drawings, in which.

DETAILED DESCRIPTION

Figure 1:
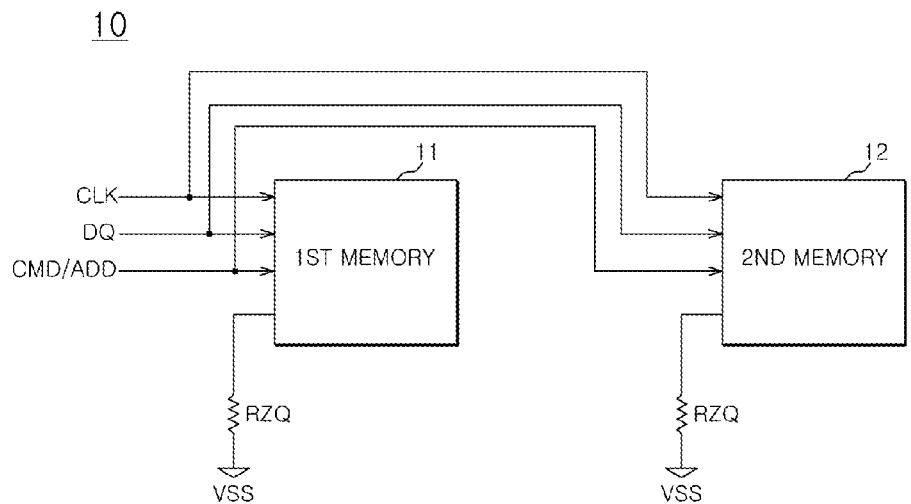
FIG. 1 is a circuit diagram illustrating an electronic system in accordance with an embodiment of the present invention.

FIG. 1 is a circuit diagram illustrating an electronic system 10. The electronic system 10 may includes first and second memories 11 and 12. The first and second memories 11 and 12 receive a clock signal CLK, a data DQ, and command and address signals CMD/ADD from a memory controller (not illustrated), and perform read and write operations in response to control signals of the memory controller. Each of the first and second memories 11 and 12 is coupled to its own external reference resistance RZQ to perform a calibration operation.

Figure 2:
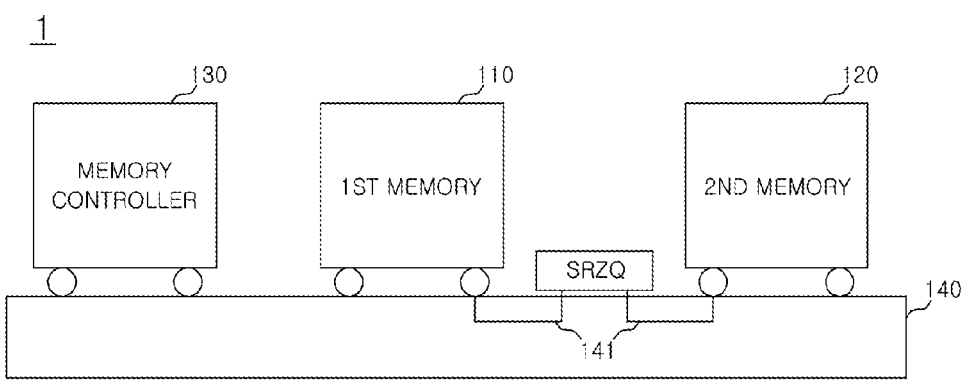
FIG. 2 is a schematic diagram illustrating an electronic system in accordance with an embodiment of the present invention.

Referring to FIG. 2, an electronic system 1 may include a first memory 110, a second memory 120, a memory controller 130, and a shared reference resistor SRZQ. The first memory 110 and the second memory 120 may be stacked on a substrate 140. For example, one memory may be stacked on the other memory. Each of the first memory 110 and the second memory 120 may include a plurality of semiconductor chips. For example, each of the first and second memories 110 and 120 may be formed of stacked semiconductor chips. The first and second memories 110 and 120 may perform data write and read operations in response to control signals of the memory controller 130. The electronic system 1 may also include the memory controller 130. For example, the memory controller 130 may be packaged in a single package together with the first and second memories 110 and 120 on the substrate 140. In an embodiment of the present invention, the electronic system 1 may be implemented in a system on chip, a system in package, or a multi-chip package. The first memory 110, the second memory 120, and the memory controller 130 may be packaged in stack-type on the substrate 140 using a bump ball, a ball grid array, or a micro bump. The substrate 140 may be a silicon substrate such as an interposer substrate, or a printed circuit board. Each of the first memory 110, the second memory 120, and the memory controller 130 may be electrically coupled to one another through a signal line such as a metal line, or a through silicon via formed in the substrate 140.

The shared reference resistor SRZQ may be disposed over the substrate 140. The shared reference resistor SRZQ may be electrically coupled in common to the first and second memories 110 and 120. Referring to FIG. 1, each of the first memory 11 and the second memory 12 has its own reference resistance RZQ, respectively. Referring to FIG. 2, the electronic system in accordance with an embodiment of the present disclosure may have a plurality of memories, which share a reference resistor. As shown in FIG. 2, for example, the shared reference resistor SRZQ may be electrically coupled in common to the first memory 110, and the second memory 120. Accordingly, each of the first and second memories 110 and 120 may perform calibration operation using the shared reference resistor SRZQ, which is coupled in common to the first and second memories 110 and 120.

Figure 3:
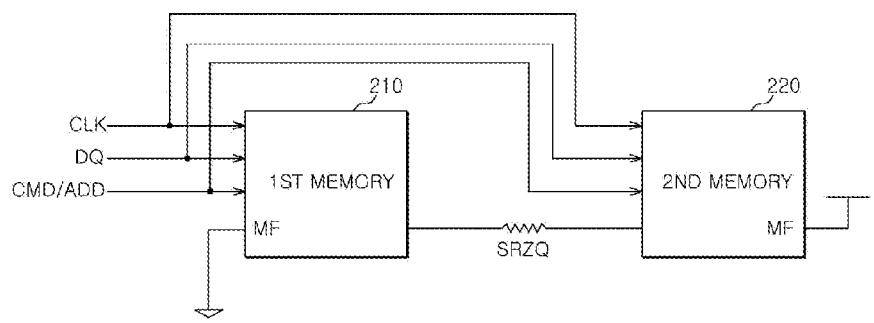
FIG. 3 is a circuit diagram illustrating an electronic system in accordance with an embodiment of the present invention.

FIG. 3 is a circuit diagram illustrating an electronic system 2 in accordance with an embodiment of the present invention. The electronic system 2 may include a first memory 210, a second memory 220, and a shared reference resistor SRZQ. The first and second memories 210 and 220 may receive a clock signal CLK, a data DQ, and command and address signals CMD/ADD from the memory controller 130 shown in FIG. 2. The first and second memories 210 and 220 may perform various operations such as a data write operation, a data read operation, a test operation, a calibration operation, and a refresh operation in response to the clock signal CLK, the data DQ, and the command and address signals CMD/ADD.

The shared reference resistor SRZQ may be coupled in common to the first and second memories 210 and 220. For example, one node of the shared reference resistor SRZQ may be electrically coupled to the first memory 210, and another node of the shared reference resistor SRZQ may be electrically coupled to the second memory 220. Each of the first and second memories 210 and 220 may selectively use the shared reference resistor SRZQ in response to the clock signal CLK, and a mirror function signal MF. When the first memory 210 uses the shared reference resistor SRZQ in response to the clock signal CLK, and the mirror function signal MF, the first memory 210 may perform a basic calibration operation thereof. When the second memory 220 uses the shared reference resistor SRZQ in response to the clock signal CLK, and the mirror function signal MF, the second memory 220 may perform a basic calibration operation thereof. Each of the first and second memories 210 and 220 may perform its own basic calibration operation independently of each other. For example, the basic calibration operation of the first memory 210 and the basic calibration operation of the second memory 220 may be performed sequentially.

The first memory 210 may use the shared reference resistor SRZQ in response to the mirror function signal MF having a first level, and the second memory 220 may use the shared reference resistor SRZQ in response to the mirror function signal MF having a second level. For example, if the first level of the mirror function signal MF is a logic high level, then the second level of the mirror function signal MF may be a logic low level. For example, if the first level of the mirror function signal MF is a logic low level, then the second level of the mirror function signal MF may be a logic high level. For example, the first level may be a ground level, and the second level may be a power source level, or vice versa.

For example, the first and second memories 210 and 220 may perform correction calibration operations thereof in response to an operation control signal, which is generated in response to the command signal CMD. The first and second memories 210 and 220 may alternately perform the correction calibration operations thereof in response to the operation control signal, and the mirror function signal MF after the first and second memories 210 and 220 complete the basic calibration operations thereof. The correction calibration operation may include any kind of calibration operation, which is performed after the basic calibration operation is completed. During the correction calibration operation, an impedance code, which is set through the basic calibration operation, may be corrected in a situation where an impedance matching is necessary due to, for example, the PVT variation. The operation control signal may be one of control signals for various operations of the first and second memories 210 and 220. For example, the operation control signal may be a refresh signal instructing the refresh operation of the first and second memories 210 and 220. In a case where the first and second memories 210 and 220 are volatile memory devices, the first and second memories 210 and 220 may perform the refresh operation for data retention. A memory does not receive data from a memory controller or does not output data to the memory controller during the refresh operation. Therefore, the memory may perform the correction calibration operation during the refresh operation.

Figure 4:
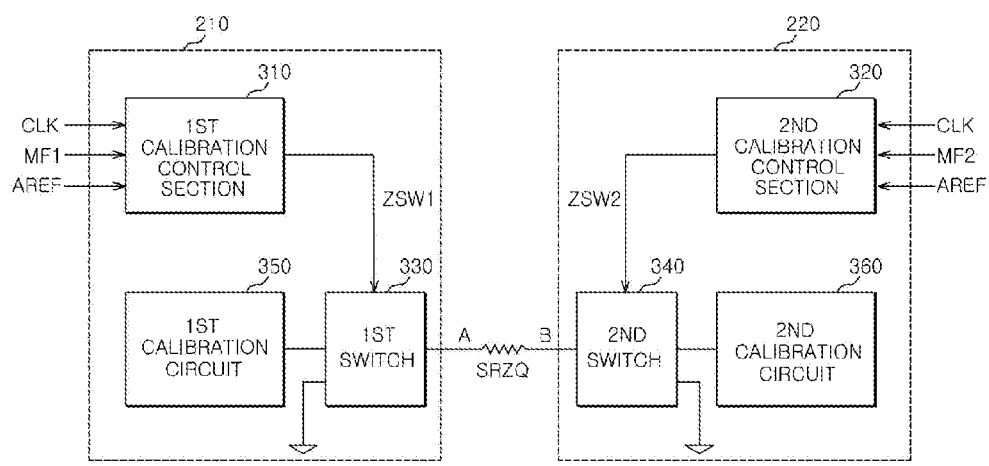
FIG. 4 is a block diagram illustrating an electronic system shown in FIG. 3.

FIG. 4 is a block diagram illustrating the electronic system 2 shown in FIG. 3. FIG. 4 shows an example configuration of the electronic system 2 including first and second memories 210 and 220, and a shared reference resistor SRZQ. Referring to FIG. 4, the first memory 210 may include a first calibration control section 310, a first switch 330, and a first calibration circuit 350. The calibration control section 310 may generate a first switch control signal ZSW1 in response to the clock signal CLK, and the mirror function signal MF having the first level (hereinafter referred to as "first mirror function signal MF1"). The first switch 330 may electrically connect the shared reference resistance SRZQ to one of the first calibration circuit 350 and the ground voltage in response to the first switch control signal ZSW1. The first calibration circuit 350 may perform a calibration operation for the first memory 210. For example, the first calibration circuit 350 may perform the calibration operation for the first memory 210 when the first calibration circuit 350 is electrically coupled to the shared reference resistor SRZQ by the first switch 330.

The second memory 220 may include a second calibration control section 320, a second switch 340, and a second calibration circuit 360. The calibration control section 320 may generate a second switch control signal ZSW2 in response to the clock signal CLK, and the mirror function signal MF having the second level (hereinafter referred to as "second mirror function signal MF2"). The second switch 340 may electrically connect the shared reference resistor SRZQ to one of the second calibration circuit 360 and the ground voltage in response to the second switch control signal ZSW2. The second calibration circuit 360 may perform a calibration operation for the second memory 220. For example, the second calibration circuit 360 perform the calibration operation for the second memory 220 when the second calibration circuit 360 is electrically coupled to the shared reference resistor SRZQ by the second switch 340.

The first and second memories 210 and 220 may share the shared reference resistor SRZQ because the first memory 210 performs a calibration operation in response to the mirror function signal MF having the first level and the second memory 220 performs a calibration operation in response to the mirror function signal MF having the second level. While one of the first and second switches 330 and 340 is electrically connected to the shared reference resistor SRZQ and performs the calibration operation, the other of the first and second switches 330 and 340 is electrically connected to the ground voltage.

Each of the first and second calibration control sections 310 and 320 may further receive an operation control signal AREF. For example, after the first and second memories 210 and 220 complete the basic calibration operations, the first calibration control section 310 may generate the first switch control signal ZSW1 in response to the operation control signal AREF, and the first mirror function signal MF1. Also, after the first and second memories 210 and 220 complete the basic calibration operations, the second calibration control section 320 may generate the second switch control signal ZSW2 in response to the operation control signal AREF, and the second mirror function signal MF2.

Figure 5:
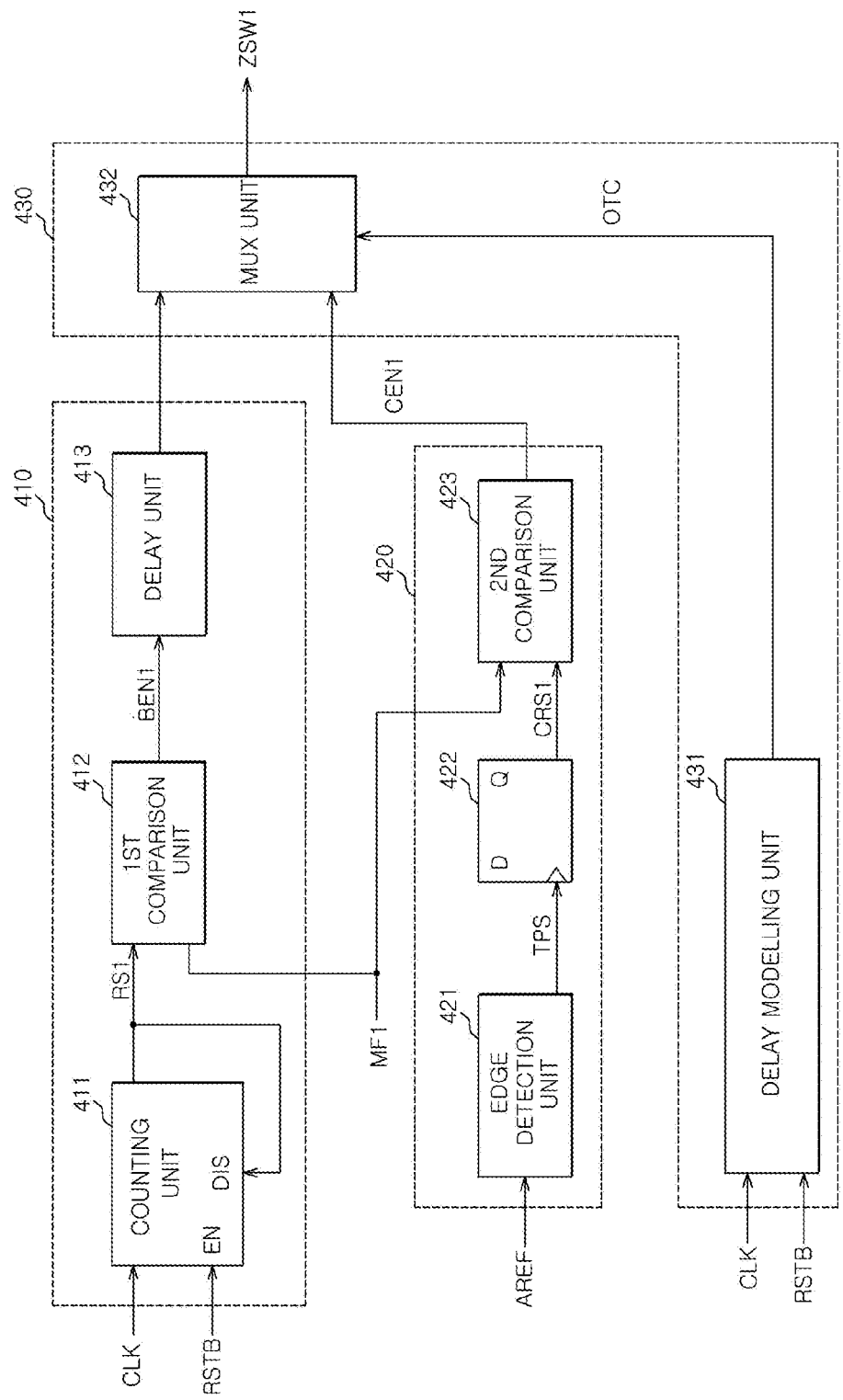
FIG. 5 is a block diagram illustrating a first calibration control section shown in FIG. 4, FIGS. 6 and 7 are timing diagrams illustrating an operation of an electronic system in accordance with an embodiment of the present invention.

FIG. 5 is a block diagram illustrating the first calibration control section 310 shown in FIG. 4. Referring to FIG. 5, the first calibration control section 310 may include a basic enablement signal generation part 410, a correction enablement signal generation part 420, and an output control part 430. The basic enablement signal generation part 410 may generate a basic enablement signal BEN1 in response to the clock signal CLK, and the first mirror function signal MF1. The correction enablement signal generation part 420 may generate a correction enablement signal CEN1 in response to the operation control signal AREF, and the first mirror function signal MF1. The output control part 430 may output one of the basic enablement signal BEN1 and the correction enablement signal CEN1 as the first switch control signal ZSW1 in response to the clock signal CLK. The output control part 430 may allow the first calibration control section 310 to firstly output the basic enablement signal BEN1 as the first switch control signal ZSW1, and then, after the first and second memories 210 and 220 complete the basic calibration operations, output the correction enablement signal CEN1 as the first switch control signal ZSW1.

The basic enablement signal generation part 410 may include a counting unit 411, and a first comparison unit 412. The counting unit 411 may generate a first reference signal RS1 in response to the clock signal CLK. The first reference signal RS1 may shift from a logic level to another logic level after a first predetermined time in response to the clock signal CLK. The counting unit 411 may receive the clock signal CLK, and may count a number of toggles of the clock signal CLK. For example, the counting unit 411 may output the first reference signal RS1 having a logic low level in response to a reset signal RSTB, and may output the first reference signal RS1 having a logic high level when the number of toggles of the clock signal CLK reaches a predetermined number. For example, the clock signal CLK may be set such that the number of toggles of the clock signal CLK reaches the predetermined number after the first predetermined time. The counting unit 411 may include a counter circuit which may receive the clock signal CLK, and the reset signal RSTB, and may be disabled by receiving the first reference signal RS1. Therefore, the counting unit 411 may generate the first reference signal RS1 having a logic low level in response to the reset signal RSTB, may generate the first reference signal RS1 having a logic high level when the number of toggles of the clock signal CLK reaches a predetermined number, and may be disabled in response to the first reference signal RS1.

The first comparison unit 412 may generate the basic enablement signal BEN1 by comparing the levels of the first reference signal RS1 and the first mirror function signal MF1. For example, the first comparison unit 412 may enable the basic enablement signal BEN1 when the levels of the first reference signal RS1 and the first mirror function signal MF1 are the same as each other, and may disable the basic enablement signal BEN1 when the levels of the first reference signal RS1 and the first mirror function signal MF1 are different from each other. The first comparison unit 412 may include an XNOR gate. In an embodiment of the present disclosure, the basic enablement signal generation part 410 may further include a delay unit 413 which may adjust an output timing of the basic enablement signal BEN1.

The correction enablement signal generation part 420 may include an edge detection unit 421, a flip-flop 422, and a second comparison unit 423. The edge detection unit 421 may generate a transition pulse TPS in response to the operation control signal AREF. For example, the edge detection unit 421 may generate the transition pulse TPS whenever the operation control signal AREF transitions from a logic high level to a logic low level.

The flip-flop 422 may change a level of a second reference signal CRS1 in response to the transition pulse TPS. For example, if the transition pulse TPS is inputted to the flip-flop 422 while the flip-flop 422 is outputting the second reference signal CRS1 having a logic low level, then the flip-flop 422 may output the second reference signal CRS1 having a logic high level. Also, the flip-flop 422 may output the second reference signal CRS1 having a logic low level again when a subsequent transition pulse TPS is inputted to the flip-flop 422. The flip-flop 422 may be a T-flip-flop.

The second comparison unit 423 may generate the correction enablement signal CEN1 by comparing the levels of the second reference signal CRS1 and the first mirror function signal MF1. The second comparison unit 423 may include an XNOR gate. For example, the second comparison unit 423 may enable the correction enablement signal CEN1 when the levels of the second reference signal CRS1 and the first mirror function signal MF1 are the same as each other, and may disable the correction enablement signal CEN1 when the levels of the second reference signal CRS1 and the first mirror function signal MF1 are different from each other.

The output control part 430 may include a delay modeling unit 431, and a MUX unit 432. The delay modeling unit 431 may receive the clock signal CLK, and may generate an output control signal OTC after a second predetermined time. Because the counting unit 411 changes the level of the first reference signal RS1 after the first predetermined time, the second predetermined may be set to be longer than the first predetermined time. For example, the second predetermined time may be twice as long as the first predetermined time.

The MUX unit 432 may output one of the basic enablement signal BEN1 and the correction enablement signal CEN1 as the first switch control signal ZSW1 in response to the output control signal OTC. For example, the MUX unit 432 may output the basic enablement signal BEN1 as the first switch control signal ZSW1 when the output control signal OTC is disabled, and may output the correction enablement signal CEN1 as the first switch control signal ZSW1 when the output control signal OTC is enabled. The delay modeling unit 431 may allow the first memory 210 to perform the correction calibration operation based on the correction enablement signal CEN1 after the first and second memories 210 and 220 complete the basic calibration operations thereof by enabling the output control signal OTC after the second predetermined time. The output control part 430 may hold the correction calibration operations of the first and second memories 210 and 220 until the first and second memories 210 and 220 complete the basic calibration operations thereof.

The configuration of the second calibration control section 320 may be the same as that of the first calibration control section 310. Unlike the first calibration control section 310, however, the second calibration control section 320 may receive the second mirror function signal MF2, the level of which is different from the level of the first mirror function signal MF1. For example, if the first mirror function signal MF1 has a logic high level, then the second mirror function signal MF2 may have a logic low level, or vice verse. Therefore, the enablement timing of the basic enablement signal and the correction enablement signal, which are generated by the second calibration control section 320, and the enablement timing of the basic enablement signal BEN1 and the correction enablement signal CEN1, which are generated by the first calibration control section 310, are not in conflict.

Figure 6:
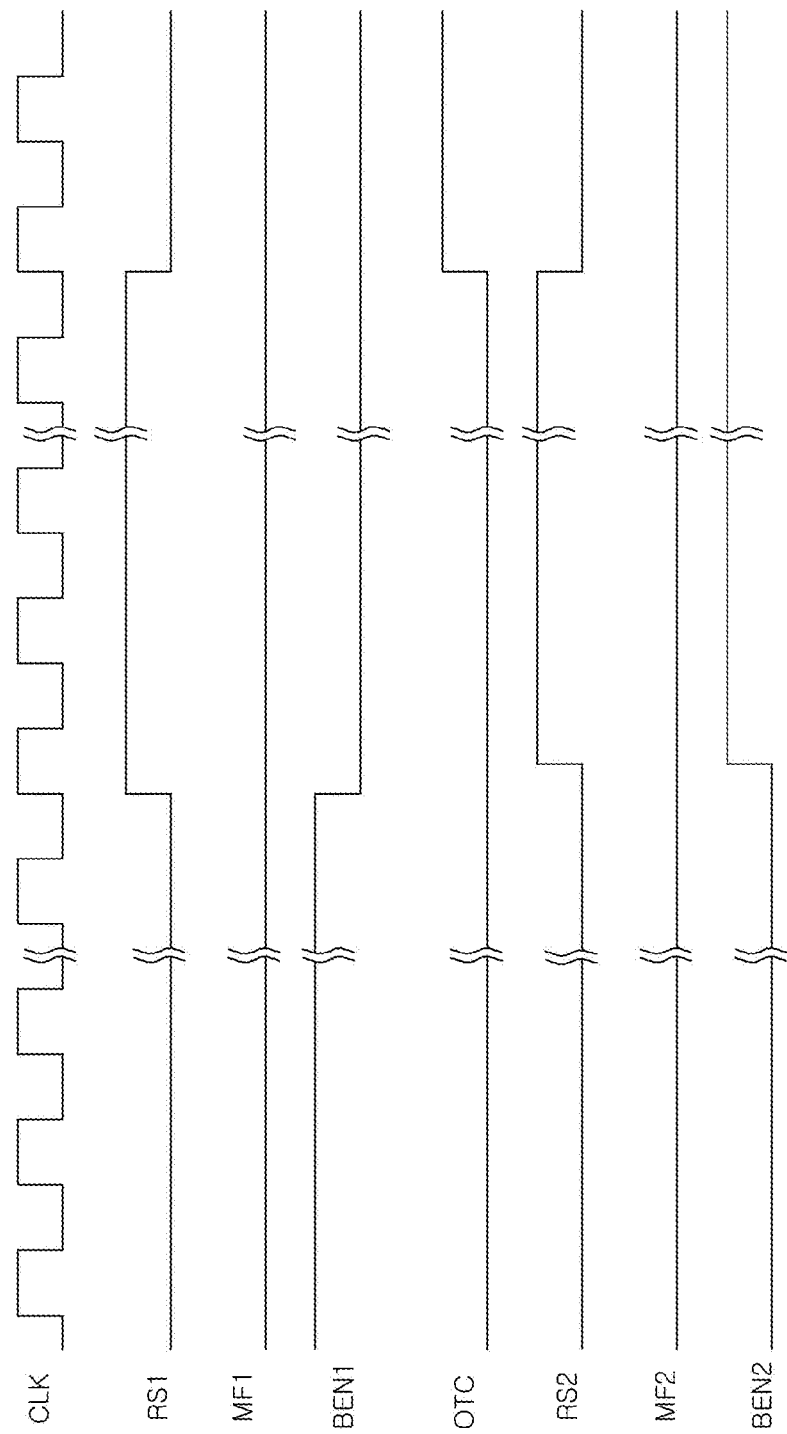
Figure 7:
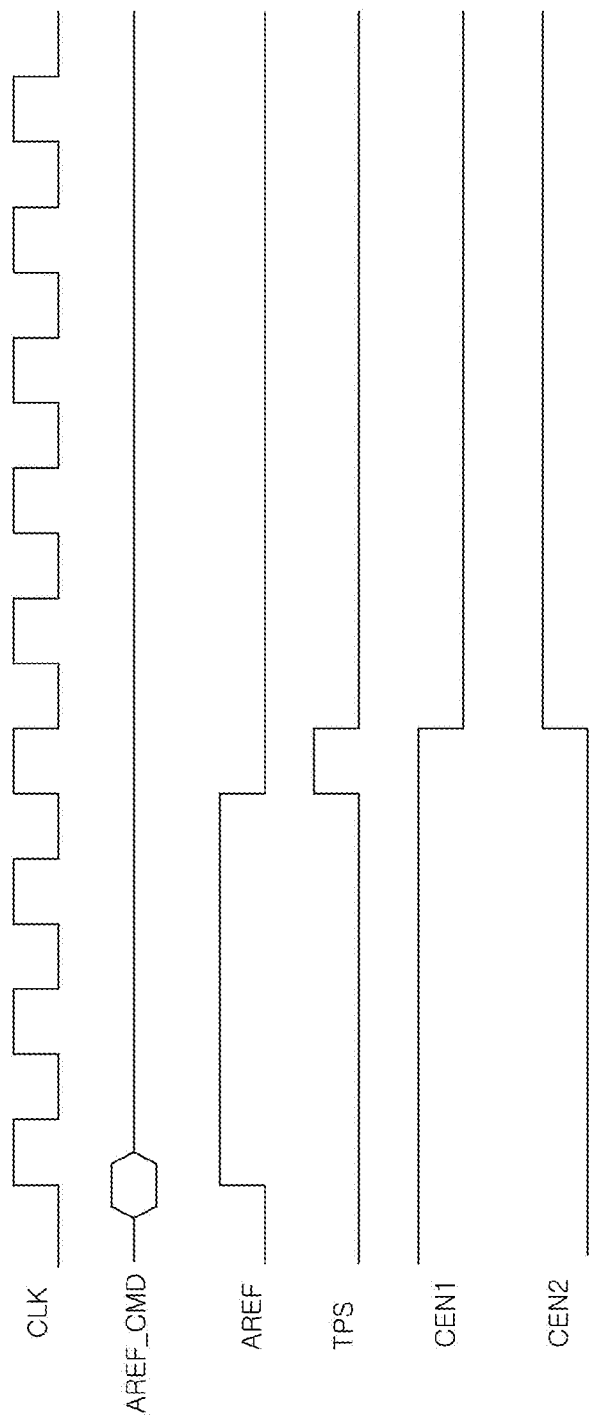

FIGS. 6 and 7 are timing diagrams illustrating an operation of an electronic system in accordance with an embodiment of the present disclosure. The operation of the electronic system will be described with reference to FIGS. 2 to 7. FIG. 6 shows the timing diagram illustrating the basic calibration operation of the first and second memories 210 and 220. The first reference signal RS1, which is generated by the counting unit 411 of the first calibration control section 310, may have firstly a logic low level, and then may transition to a logic high level when the number of toggles of the clock signal CLK reaches a predetermined number. Similarly, the first reference signal RS2, which is generated by the counting unit of the second calibration control section 320, may transition from a logic low level to a logic high level.

The first mirror function signal MF1, which is received by the first calibration control section 310, may have a logic low level, and the second mirror function signal MF2, which is received by the second calibration control section 320, may have a logic high level. Therefore, the first comparison unit 412 of the first calibration control section 310 may enable the basic enablement signal BEN1 when the first reference signal RS1 has a logic low level, and may disable the basic enablement signal BEN1 when the first reference signal RS1 transits to a logic high level. The second calibration control section 320 may receive the second mirror function signal MF2 having a logic high level, and therefore the basic enablement signal BEN2, which is generated by the second calibration control section 320, may have the opposite level to the basic enablement signal BEN1, which is generated by the first calibration control section 310. Accordingly, the MUX unit 432 of the first calibration control section 310 may output the enabled basic enablement signal BEN1 as the first switch control signal ZSW1, and the second calibration control section 320 may output the disabled basic enablement signal BEN2 as the second switch control signal ZSW2. The first switch 330 may electrically connect the shared reference resistor SRZQ to the first calibration circuit 350, and the second switch 340 may be electrically connected to the ground voltage. The first calibration circuit 350 may perform the basic calibration operation for the first memory 210 using the shared reference resistor SRZQ. After that, when the basic enablement signal BEN1 of the first memory 210 is disabled, and the basic enablement signal BEN2 of the second memory 220 is enabled, the first switch 330 may be electrically connected to the ground voltage, and the second switch 340 may electrically connect the shared reference resistor SRZQ to the second calibration circuit 360. The second calibration circuit 360 may perform the basic calibration operation for the second memory 220 using the shared reference resistor SRZQ. The delay modeling unit 431 may enable the output control signal OTC when the first and second memories 210 and 220 complete the basic calibration operations thereof. Therefore, the MUX unit 432 of the first calibration control section 310 may output the correction enablement signal CEN1 instead of the basic enablement signal BEN1 as the first switch control signal ZSW1. The MUX unit of the second calibration control section 320 may also output the correction enablement signal as the second switch control signal ZSW2.

FIG. 7 shows the timing diagram illustrating the correction calibration operation of the first and second memories 210 and 220. Firstly, the second comparison unit 423 of the first calibration control section 310 may receive the second reference signal CRS1 and the first mirror function signal MF1, which have logic low levels, and thus may enable the correction enablement signal CEN1. Also, the first calibration circuit 350 of the first memory 210 may perform the correction calibration operation by being electrically connected to the shared reference resistor SRZQ. When the first and second memories 210 and 220 receive an operation control command AREF_CMD as the command signal CMD, the first and second memories 210 and 220 may internally generate the operation control signal AREF. The edge detection unit 421 of the first memory 210 may generate the transition pulse TPS by detecting a falling edge of the operation control signal AREF. The flip-flop 422 may change the level of the second reference signal CRS1 to a logic high level in response to the transition pulse TPS, and the second comparison unit 423 may disable the correction enablement signal CEN1. The second memory 220 may receive the second mirror function signal MF2 having a logic high level, and therefore the correction enablement signal CEN2 of the second memory 220 may be disabled, and then may be enabled in response to the subsequent transition pulse TPS. Accordingly, the second calibration circuit 360 of the second memory 220 may perform the correction calibration operation by being electrically connected to the shared reference resistor SRZQ. After that, when the operation control signal AREF is generated due to another subsequent input of the operation control command AREF_CMD to the first and second memories 210 and 220, the correction enablement signal CEN1 of the first memory 210 may be enabled, and the correction enablement signal CEN2 of the second memory 220 may be disabled. Therefore, the first and second memories 210 and 220 may alternately perform the correction calibration operation whenever the operation control signal AREF is inputted to the first and second calibration control sections 310 and 320.

Figure 8:
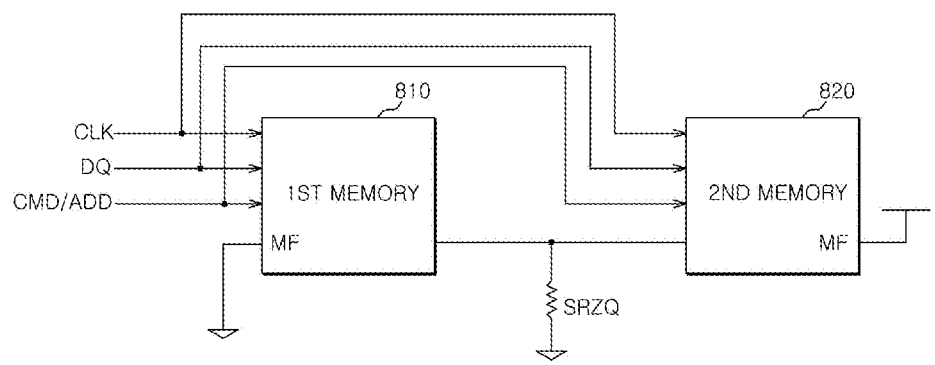
FIG. 8 is a circuit diagram illustrating an electronic system in accordance with an embodiment of the present invention.

FIG. 8 is a circuit diagram illustrating an electronic system 3 in accordance with an embodiment of the present disclosure. Referring to FIG. 8, the electronic system 3 may include a first memory 810, a second memory 820, and a shared reference resistor SRZQ. The first and second memories 810 and 820 may receive a clock signal CLK, a data DQ, and command and address signals CMD/ADD from the memory controller 130 described above with reference to FIG. 2. The first memory 810 may be electrically coupled to the shared reference resistor SRZQ, and may receive a first mirror function signal MF1 having a first level. The second memory 820 may also be electrically coupled to the shared reference resistor SRZQ, and may receive a second mirror function signal MF2 having a second level. The shared reference resistor SRZQ may also be electrically coupled to the ground voltage. The first and second memories 810 and 820 of the electronic system 3 may be coupled in common to the shared reference resistor SRZQ, which is coupled to the ground voltage. Unlike the electronic system 3 in FIG. 8, the electronic system 2 described above with reference to FIG. 3 may have a cross-coupled structure in which the shared reference resistor SRZQ, which is coupled in common to the first memory 310 and the second memory 320, is not coupled to the ground voltage.

Figure 9:
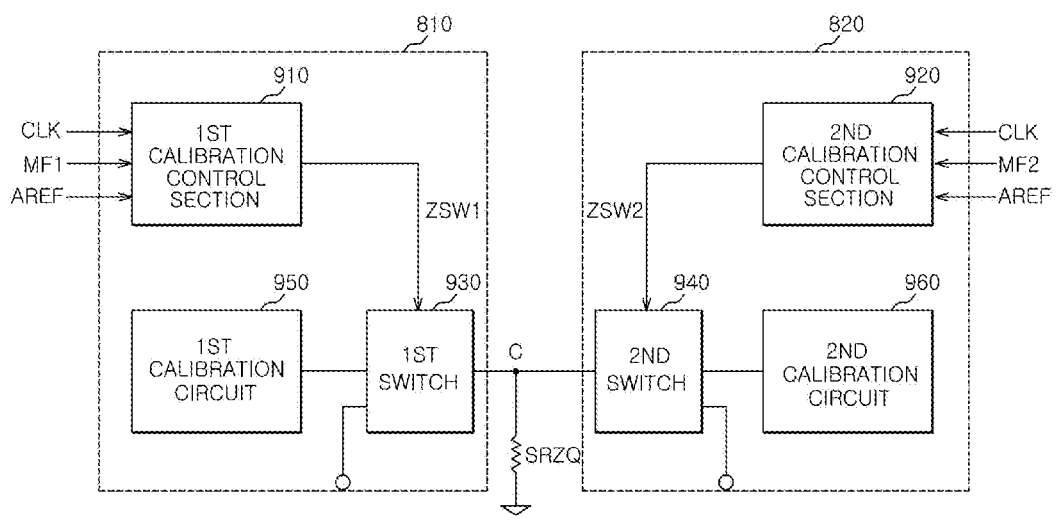
FIG. 9 is a block diagram illustrating an electronic system shown in FIG. 8.

FIG. 9 is a block diagram illustrating the electronic system 3 shown in FIG. 8. FIG. 9 shows an example configuration of the electronic system including the first and second memories 810 and 820, and a shared reference resistor SRZQ. Referring to FIG. 9, the first memory 810 may include a first calibration control section 910, a first switch 930, and a first calibration circuit 950. The calibration control section 910 may generate a first switch control signal ZSW1 in response to the clock signal CLK, a first mirror function signal MF1, and an operation control signal AREF. The first switch 930 may electrically connect a node C, which is coupled to the shared reference resistor SRZQ, to one of the first calibration circuit 950 and a floating node in response to the first switch control signal ZSW1. When the node C, which is coupled to the shared reference resistor SRZQ, becomes electrically coupled to the first calibration circuit 950 by the first switch 930, the basic calibration operation and the correction calibration operation for the first memory 810 may be performed. Also, when the basic calibration operation and the correction calibration operation for the second memory 820 are performed, the node C, which is coupled to the shared reference resistor SRZQ, may be electrically coupled to the floating node by the first switch 930.

The second memory 820 may include a second calibration control section 920, a second switch 940, and a second calibration circuit 960. The calibration control section 920 may generate a second switch control signal ZSW2 in response to the clock signal CLK, a second mirror function signal MF2, and the operation control signal AREF. The second switch 940 may electrically connect the node C, which is coupled to the shared reference resistor SRZQ, to one of the second calibration circuit 960 and the floating node in response to the second switch control signal ZSW2. When the node C, which is coupled to the shared reference resistor SRZQ, becomes electrically coupled to the second calibration circuit 960 by the second switch 940, the basic calibration operation and the correction calibration operation for the second memory 820 may be performed. Also, when the basic calibration operation and the correction calibration operation for the first memory 810 are performed, the node C, which is coupled to the shared reference resistor SRZQ, may be electrically coupled to the floating node by the second switch 940. The first and second memories 810 and 820 may be the same as the first and second memories 210 and 220 described above with reference to FIG. 4 except for the configuration with respect to the shared reference resistor SRZQ.

While certain embodiments have been described above, it will be understood to those skilled in the art that the embodiments described are by way of example only. Accordingly, the electronic system including memories sharing calibration reference resistor should not be limited based on the described embodiments. Rather, the electronic system including memories sharing a calibration reference resistor described herein should only be limited in light of the claims that follow when taken in conjunction with the above description and accompanying drawings.

What is claimed is:

1. A system comprising:
   a shared reference resistor configured to be used in a calibration operation;
   a first memory electrically coupled to the shared reference resistor; and
   a second memory electrically coupled to the shared reference resistor,
   wherein each of the first and second memories performs a basic calibration operation thereof by selectively using the shared reference resistor in response to a clock signal and a mirror function signal,
   wherein the first memory Performs the basic calibration operation when the mirror function signal has a first level, and the second memory performs the basic calibrations operation when the mirror function signal has a second level.

2. The system of claim 1, wherein each of the first and second memories performs a correction calibration operation thereof by alternately using the shared reference resistor in response to an operation control signal, and the mirror function signal.

3. The system of claim 2, wherein the operation control signal is a refresh signal.

4. The system of claim 2, wherein the first memory performs the basic calibration operation and the correction calibration operation thereof in response to a first mirror function signal having the first level, and the second memory performs the basic calibration operation and the correction calibration operation thereof in response to a second mirror function signal having the second level.

5. The system of claim 2, wherein the mirror function signal includes a first mirror function signal, and wherein the first memory comprises:
   a first calibration control section configured to generate a first switch control signal in response to the clock signal, the operation control signal, and the first mirror function signal; and
   a first switch configured to electrically connect the shared reference resistor to one of a first calibration circuit and a ground voltage in response to the first switch control signal.

6. The system of claim 5, wherein the mirror function signal includes a second mirror function signal, and wherein the second memory comprises:
   a second calibration control section configured to generate a second switch control signal in response to the clock signal, the operation control signal, and the second mirror function signal; and
   a second switch configured to electrically connect the shared reference resistor to one of a second calibration circuit and the ground voltage in response to the second switch control signal.

7. The system of claim 5, wherein the first calibration control section comprises:
   a basic enablement signal generation part configured to generate a basic enablement signal in response to the clock signal, and the first mirror function signal;
   a correction enablement signal generation part configured to generate a correction enablement signal in response to the refresh signal, and the first mirror function signal; and
   an output control part configured to output the basic enablement signal as the first switch control signal, and then, after the first and second memories complete the basic calibration operations thereof, output the correction enablement signal as the first switch control signal.

8. The system of claim 7, wherein the basic enablement signal generation part comprises:
   a counting unit configured to generate a first reference signal, a logic level of which shifts from a logic level to another logic level after a first predetermined time in response to the clock signal; and
   a first comparison unit configured to generate the basic enablement signal by comparing the levels of the first reference signal and the first mirror function signal.

9. The system of claim 7, wherein the correction enablement signal generation part comprises:
- an edge detection unit configured to generate a transition pulse by detecting reception of the operation control signal;
- a flip-flop configured to output a second reference signal, a logic level of which shifts from a logic level to another logic level whenever the transition pulse is inputted thereto; and
- a second comparison unit configured to generate the correction enablement signal by comparing the levels of the second reference signal and the first mirror function signal.

10. The system of claim 8, wherein the output control part comprises:
- a delay modeling unit configured to generate an output control signal after a second predetermined time in response to the clock signal; and
- a MUX unit configured to output one of the basic enablement signal and the correction enablement signal as the first switch control signal in response to the output control signal.

11. The system of claim 10, wherein the second predetermined time is at least twice as long as the first predetermined time.

12. A system comprising:
- a shared reference resistor coupled to a ground voltage;
- a first memory electrically coupled to the shared reference resistor; and
- a second memory electrically coupled to the shared reference resistor,
- wherein each of the first and second memories performs a basic calibration operation thereof by being selectively connected to the shared reference resistor in response to a clock signal and a mirror function signal,
- wherein the first memory performs the basic calibration operation when the mirror function signal has a first level, and the second memory performs the basic calibrations operation when the mirror function signal has a second level.

13. The system of claim 12, wherein each of the first and second memories performs a correction calibration operation thereof by alternately using the shared reference resistor in response to an operation control signal, and the mirror function signal.

14. The system of claim 13,
- wherein the first memory performs the basic calibration operation and the correction calibration operation thereof in response to a first mirror function signal having the first level, and
- the second memory performs the basic calibration operation and the correction calibration operation thereof in response to a second mirror function signal having the second level.

15. The system of claim 13, wherein the mirror function signal includes a first mirror function signal, and wherein the first memory comprises:
- a first calibration control section configured to generate a first switch control signal in response to the clock signal, the operation control signal, and the first mirror function signal; and
- a first switch configured to electrically connect the shared reference resistor to one of a first calibration circuit and a floating node in response to the first switch control signal.

16. The system of claim 15, wherein the mirror function signal includes a second mirror function signal, and wherein the second memory comprises:
- a second calibration control section configured to generate a second switch control signal in response to the clock signal, the operation control signal, and the second mirror function signal; and
- a second switch configured to electrically connect the shared reterence resistor to one of a second calibration circuit and the floating node in response to the second switch control signal.

17. A method of calibration for a system including first and second memories coupled in common to a shared reference resistor, the method comprising:
- performing a basic calibration operation for one of the first and second memories for a first time section in response to a clock signal, and a mirror function signal;
- performing the basic calibration operation for the other one of the first and second memories for tho first time section in response to the clock signal, and the mirror function signal; and
- alternately performing correction calibration operations for the first and second memories in response to an operation control signal, and the mirror function signal.

18. The method of claim 17, wherein the first memory performs the basic calibration operation thereof in response to a first mirror function signal having a first level, and
- the second memory performs the basic calibration operation thereof in response to a second mirror function signal having a second level.

19. The method of claim 17, wherein the correction calibration operations for the first and second memories are not performed within a second time section, and
- wherein the second time section is at least twice as long as the first time section.

20. The method of claim 17, wherein the shared reference resistor is electrically coupled to a calibration circuit of the first memory, and electrically coupled to a ground voltage through an internal circuit of the second memory when the basic calibration operation and the correction calibration operation of tho first memory are performed, and
- wherein the shared reference resistor is electrically coupled to a calibration circuit of the second memory, and electrically coupled to the ground voltage through an internal circuit of the first memory when the basic calibration operation and the correction calibration operation of the second memory are performed.

* * * * *